(12) United States Patent
Petrov

(10) Patent No.: US 7,728,743 B2
(45) Date of Patent: Jun. 1, 2010

(54) DEVICE AND METHOD FOR POLYPHASE RESAMPLING

(75) Inventor: Mihail Petrov, Langen (DE)

(73) Assignee: Trident Microsystems (Far East) Ltd., Grand Cayman (KY)

( * ) Notice: Subject to any disclaimer, the term of this patent is extended or adjusted under 35 U.S.C. 154(b) by 155 days.

(21) Appl. No.: 11/904,328

(22) Filed: Sep. 26, 2007

(65) Prior Publication Data

US 2009/0261994 A1 Oct. 22, 2009

(30) Foreign Application Priority Data

Sep. 26, 2006 (DE) .................. 10 2006 045 794

(51) Int. Cl.
*H03M 7/00* (2006.01)
(52) U.S. Cl. ............... 341/61; 375/232; 324/76.19
(58) Field of Classification Search ............ 341/61; 375/232; 708/313; 324/76.19
See application file for complete search history.

(56) References Cited

U.S. PATENT DOCUMENTS 4,825,398 A   4/1989  Koch et al.
5,933,452 A * 8/1999  Eun ........................ 375/232
6,522,121 B2 * 2/2003  Coumou ................. 324/76.19
2002/0184278 A1 * 12/2002  Menkhoff .................. 708/313
2004/0120361 A1   6/2004  Yu et al.

FOREIGN PATENT DOCUMENTS

EP       06 65 546 A2     8/1995

OTHER PUBLICATIONS

C.W. Farrow, A Continuously Variable Digital Delay Element, (IEEE International Symposium on Circuits and Systems, 1988, Bd. 3, S. 2641-2645).

* cited by examiner

*Primary Examiner*—Jean B Jeanglaude
(74) *Attorney, Agent, or Firm*—DLA Piper LLP (US)

(57) ABSTRACT

A methods and devices for polyphase resampling are presented which may comprise a coefficient generator which provides a plurality of coefficients and an interpolation arrangement used to carry out the resampling by means of the coefficients applied to input data provided for resampling in order to provide output data. In one possible implementation the coefficient generator is constructed and/or controlled so as to provide the coefficients for the resampling in the form of linearly interpolated coefficients. In another alternative implementation, a plurality of at least two data interpolation filters are provided for the interpolation of a corresponding number of parallel input data, wherein the coefficients are input to each of the data interpolation filters.

12 Claims, 5 Drawing Sheets

Original FIR Filter        Polyphase Coefficients

DEVICE AND METHOD FOR POLYPHASE RESAMPLING

The invention relates to a device and a method for polyphase resampling. The term resampling should be understood as a new determination of supporting points within a temporal sequence, that is to say a new sampling of a data sequence by means of an interpolation method.

BACKGROUND OF THE INVENTION

Two solutions are known for hardware conversion of polyphase resampling. The first solution is presently used for scaling of images in video processing chips. As clearly shown in FIG. 9, an input data sequence Din is input to a polyphase filter bank 1. In the illustrated example, the polyphase filter bank 1 outputs five output values on five lines, wherein the first four lines are input to a first multiplexer MUX1 and the last four lines of these lines are input to a second multiplexer MUX2. In addition, a phase value p, ranging from 0 to 1, is input to the circuit through a bus having N lines. The two most significant bits (MSB/Most Significant Bit) are input to a control input of both multiplexers MUX1, MUX2. Both output lines of the two multiplexers MUX1, MUX2 and the N−2 of the least significant bit (LSB/Least Significant Bit) of the phase value p are input to an interpolation circuit 2. The interpolation circuit 2 comprises a first adder 3, so that to the first input thereof is coupled to the output of the second multiplexer MUX2. At a second input of the first adder 3 is provided the sign-inverted output of the first multiplexer MUX1, so that the value provided from this output is subtracted. An output value of the first adder 3 is multiplied by the N−2 least significant bit of the phase value p by a multiplier 4. The result of the multiplication of the multiplier 4 is provided to an input of the second adder 5, and the output value of the first multiplexer MUX1 is input to another input of this adder for addition. A sequence of output values of the second adder 5 is input to a data output as output data Dout.

With a similar circuit arrangement, a fixed number of output values, usually $2^K+1$, is generated with sub-sample phases at an equal interval (0 . . . 1). One pair of the samples adjacent to each other will be selected depending on the desired phase. The output sample, provided as a data value of the output data Dout, is obtained with a linear interpolation between these values. Accordingly, when K=2, there are five output values in the illustrated embodiment which have the phases 0, ¼, 2/4, ¾, 1. The first phase 0 corresponds as a first of these phase values p to the current sample of the input data Din and the phase 1 of the next sample. The phases in between, or intermediate phases, are generated by means of a hierarchical treelike structure by the filter banks. In such a case, only symmetrical half band filters with a constant coefficient are used. FIG. 9 shows a circuit arrangement for the case when K=2.

According to the second solution, shown in a simplified manner in FIG. 10, two interpolation FIR filters (FIR: Final Impulse Response) are used with a variable coefficient. The output sample is determined by linear interpolation between two filter output values.

Coefficient formulations in this case are predefined for a predetermined number of equidistant phases, usually $2^K+1$. Depending on the output phase, two adjacent coefficients are selected by means of multiplexers and input to the interpolation filter. FIG. 10 again shows the case when K=2.

The input data Din are in this case input to two interpolation FIR filters 6, wherein six first coefficients C0-1, C1-1, . . . , C5-1 of a 8×4:1 multiplexer 7 are input as coefficients to the first of the interpolation FIR filter 6. Six further coefficients C0-0, C1-0, . . . , C5-0 are input to the second interpolation FIR filter 6. In this formulation, the two most significant bits (MSB) of the phase value m, which is again input via a bus with n lines, to the corresponding twelve inputs of the multiplexer 7. The output values of both interpolation FIR filters 6 are again input, as shown in the case of the circuit arrangement indicated in FIG. 9, to an interpolation circuit 2. In addition, the least significant bits N−2 of the phase value p are again input to the interpolation circuit 2.

Nevertheless, both circuit arrangements have disadvantages. According to the first solution shown in FIG. 1, only two of the $2^K+1$ polyphase values are used for a given output phase in order to carry out linear interpolation. However, both output values are not used. In spite of that, all the output values must be generated so as to have all possible phase values p available in the range of [0 . . . 1]. An increase in the number of polyphase output values, which would increase the precision of interpolation, would make the solution even more ineffective. A particular disadvantage is also the fact that a similar hierarchical filter bank structure cannot be easily scaled for different numbers of polyphase output values. The disadvantage of the second solution shown in FIG. 10 is that the multiplier and the adder of the interpolation filter must be duplicated. A disadvantage shared by both solutions is that when several channels are to be interpolated in parallel to each other, a linear interpolation must be carried out separately for each individual channel.

The task of the present invention is to propose a device and a method for polyphase resampling, which enables a reduced expense, while at the same time achieving an equally good or better precision.

Arrangements provided with one FIR filter and used as a continuously variable digital delay element are generally known from C. W. Farrow, Continuously Variable Digital Delay Element, AT & T, Middletown, N.J. 07748, 1988 IEE. Such an architecture, however, is used only for the calculation of coefficients for a Lagrange polynomial interpolation, and it is also referred to as Farrow structure.

This task is solved by a device for polyphase resampling which has the characteristics according to claim 1, or by the method for polyphase resampling having the characteristics according to claim 10. Advantageous embodiments are the subject of dependent claims.

SUMMARY OF THE INVENTION

Accordingly, preferred is a device for polyphase resampling having a coefficient generator in order to provide a plurality of coefficients and an interpolation arrangement for the realization of the resampling of input data by means of the coefficients to provide output data, wherein the coefficient generator is designed and/or controlled to provide the coefficients for the resampling which are supplied as linearly interpolated coefficients.

Preferred is a plurality of at least two data interpolation filters for the interpolation of a corresponding number of input data supplied in parallel, wherein the coefficients are input to each of the data interpolation filters. The data interpolation filters are preferably constructed as interpolation FIR filters.

It is in this case advantageous when at least one interpolation circuit is constructed in the coefficient generator in order to generate the coefficients from constant coefficients. However, preferred is a plurality of at least two such interpolation circuits in the coefficient generator, which generate the coefficients from constant coefficients. The constant coefficients of this arrangement are input in a simple manner by means of a storage section or a data input.

It is also preferred when a plurality of at least two interpolation circuits are constructed in the coefficient generator in order to generate internal coefficients and a normalization circuit is used to provide coefficients to be used for the resampling.

Such devices are preferably equipped with at least two multiplexers for the multiplexing of a first coefficient sequence from coefficients on two inputs, while one provides a phase value comprising a plurality of bits with a phase accumulator, wherein the most significant bits of the plurality of bits are input to the multiplexers to control the multiplexers, and the least significant bits of the plurality of bits are input to the interpolation circuits. It is preferred in this case when a number of the most significant bits are input to the multiplexers according to the number of the multiplexers, and the remaining number of the plurality of bits is in each case input to the interpolation circuits.

The method is realized with a coefficient generator for polyphase resampling, which provides a plurality of coefficients and wherein the resampling is performed by means of the coefficients based on input data in order to provide output data submitted for resampling, wherein the coefficients for resampling are provided as linearly interpolated coefficients.

It is preferred in this case when the same coefficients are input to each of the data interpolation filters of a plurality of at least two data interpolation filters for the interpolation of a corresponding number of parallel input data.

In accordance with the method, the coefficients are generated in the coefficient generator from constant coefficients. In a first preferred step, internal coefficients are in this case generated and normalized to be provided for the resampling of coefficients to be used.

A central idea of the device or of the method is that an interpolation or a resampling is performed with the filtering of the input signal or of the input data with a FIR filter whose coefficients depend on the phase of the interpolated sampling value relative to the sampling values at the input. The coefficients of the interpolation filter are thus generated by means of a linear interpolation from a number of predefined coefficient formulations for equidistant sub-sample phases. For quantized coefficients, the interpolation is carried out via a stage in which an effect is exerted through the interpolation process. A corresponding architecture of a circuit arrangement is particularly efficient with interpolation using multiple channels. Since all channels are sampled again or resampled at the same time, the coefficient generating block can be used to generate shared coefficients. Only the interpolation FIR filter must be replicated for each filter.

An embodiment will now be explained in more detail based on the attached drawings. Unified reference symbols are used for the components and functions or data values referred in the figures, indicating the same components or components having a similar function, functions or data values, so that each of the detailed explanations can be referred to also in the detailed explanation provided in other figures, which show the following:

DETAILED DESCRIPTION OF THE INVENTION

Figure 1:
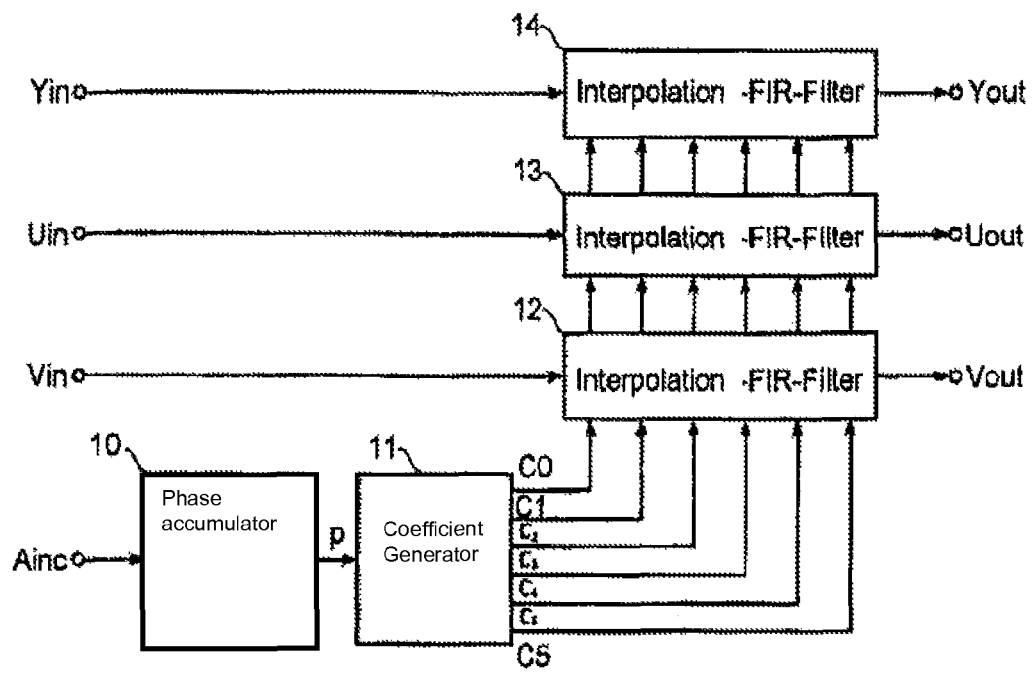
FIG. 1 an example of interpolation architecture for a multi-channel interpolation used to illustrate the basic principle of a device or method for polyphase resampling, FIG. 2 components of an actual circuit arrangement or architecture for the realization of resampling, FIG. 3 diagrams illustrating an interpolation filter for decomposition of polyphases, FIG. 4 diagrams illustrating a linear interpolation between stored coefficients, FIG. 5 a schematic representation of the construction of a coefficient generator, FIG. 6 components of a circuit arrangement for a new standardization of coefficients after interpolation, FIG. 7 an image of a zone plate test pattern for original standard definition, FIG. 8 a section of a high definition result in an enlarged illustration after scaling, FIG. 9 schematic representation of the components of a circuit arrangement for the realization of resampling based on a first solution according to prior art, and FIG. 10 a schematic representation of a circuit arrangement based on a second solution according to prior art.

FIG. 1 shows a schematic diagram of a preferred device for polyphase resampling. Three different input connections are provided for the input of three different sequences of input data Yin, Uin, Vin to three different interpolation FIR filters 12, 13, 14. In addition, coefficients Co, C1, ... C5 are input to each of the interpolation FIR filters 12-14. A special characteristic of this embodiment is that each of the coefficients C0, C5 is input through its own line or through looped lines to each of the interpolation FIR filters 12-14. Accordingly, all interpolation filters operate with the same coefficients C0-C5. Output data Yout, Uout, Vout are provided on one output of the interpolation FIR filters 12-14. This output data Yout, Uout, Vout is generated by means of the coefficients C0-C5 from the input data Yin, Uin and Vin. This input data or output data in this case comprises data such as for example data of an audio signal having up to five channels and data of a video data stream, for example in the RGB or YUV formats which are per se known.

Control signal Ainc is provided at one input of a phase accumulator 10 in order to generate the coefficients C0-C5. The data of the input; control signal Ainc is thereby accumulated and a phase value p is provided as an output for a coefficient generator 11. The coefficient generator 11 generates the coefficients C0-C5 with the input phase value p.

With such a circuit arrangement, the input data Yin, Uin, Vin, input through various input lines, is provided in a suitable manner with one identical formulation of the coefficients C0-C5, which is supplied from the coefficient generator 11 and filtered in its own interpolation FIR filter 12-14. In this case, the term input data Yin, Uin, Vin should be understood to also include data for the control signal or data streams or signals, which should be understood in the case of a circuit arrangement containing a higher-order circuit as input data for this special circuit arrangement and for the components described therein. This, however, does not exclude integration of the input data Yin, Uin, Vin in all cases in a higher-order circuit arrangement that also includes data originating from an external data source from the viewpoint of a higher-order circuit arrangement. The same is true also about the output data Yout, Uout, Vout, which can, according to this embodiment be viewed as output data of the particular illustrated circuit arrangement, while it can be also viewed as output data of a higher-order circuit. In particular, an advantageous circuit arrangement does not have to be provided with three channels parallel to each other which are equipped with three interpolation FIR filters 12-14. Circuit arrangements which have fewer filters, in particular only one interpolation FIR filter 12, or which are equipped with a plurality of additional interpolation filters used for filtering of input data with further channels can be also implemented within the framework of such a circuit arrangement.

Figure 9:
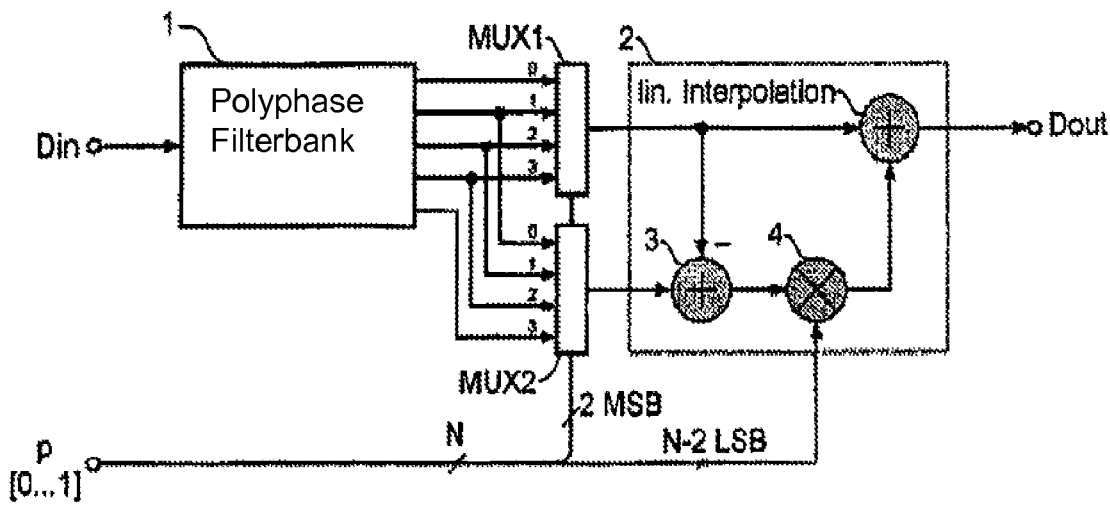
Figure 10:
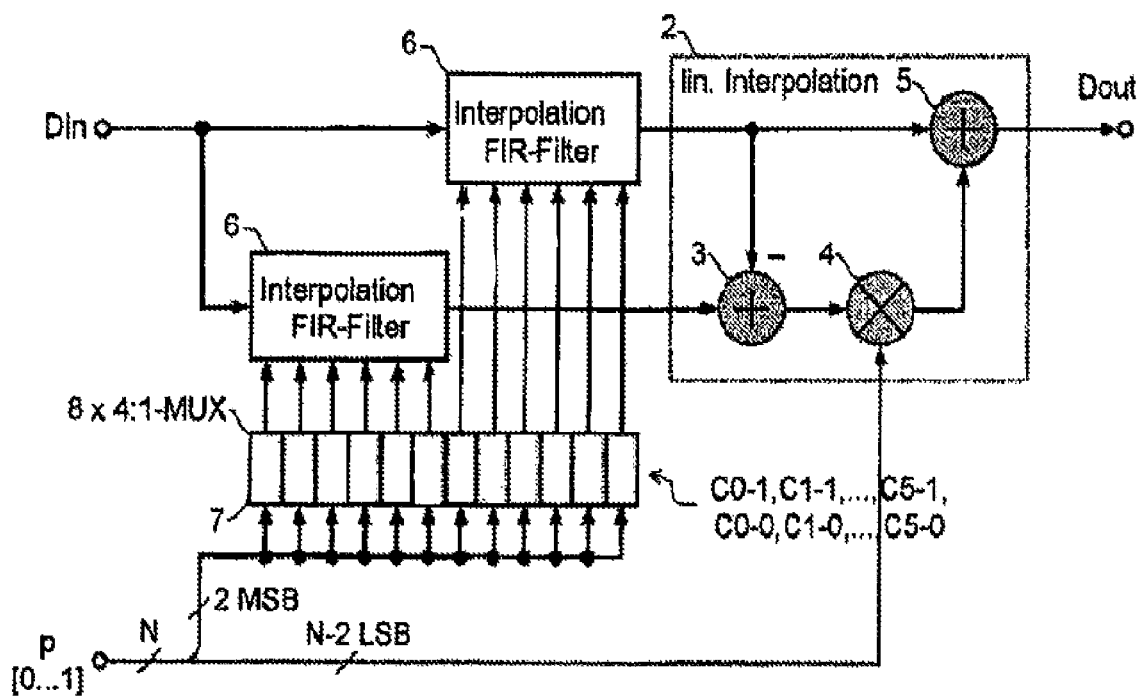

Such a circuit arrangement offers in comparison to both circuit arrangements according to FIG. 9 or FIG. 10 a number of advantages. For example, only a single generic interpolation filter is required for each channel. The same coefficients are used for all channels. Another advantage is due to the fact that the coefficients C0-C5 are dependent only on the desired output phase and therefore can be generated with a common block, which is used jointly for all channels. Such a solution is preferable as it is very efficient as well as scalable for as many channels as required. Each further channel only requires addition of only one single additional interpolation filter.

These multiple advantages are possible thanks to the finding that a combination of various aspects of both solutions, that are per se known, can be realized based on the preconditions of linearity.

The central block of the circuit arrangement is formed by the coefficient generator 11. Instead of performing a linear interpolation at the output of the interpolation filter, interpolation with the coefficients C0-C5 is used. Since one interpolation is a linear operation, the shifting of the interpolation from the filter output to the coefficients has no effect on the final result, as one can see from Formula 1, $$Y_{int} = Int(Y_0, Y_1) = Int\left(\sum_k C_{0k} X_k, \sum_k C_{1k} X_k\right) = \sum_k Int(C_{0k} C_{1k}) X_k \quad (1)$$

wherein $X_k$ is the original or initial sampling value in the filter taps, $C_{0k}$ and $C_{1k}$ are the coefficient formulations for both filters, $Y_0$ and $Y_1$ are the output values of the filter, and $Y_{int}$ indicates the output data after the linear interpolation.

One advantage of the proposed interpolation architecture can be ascertained in particular in the case when multiple channels are used, which is shown in a simplified manner in FIG. 1. In similar exemplary applications, the data is resampled simultaneously in more than one data channel. Possible examples of corresponding multi-channel signals include for instance complex signals in communication connections, audio signals having in particular up to five channels, and image data streams, for example, according to RGB or YUV. Both the phase accumulator 10 and the coefficient generator 11 can advantageously be used jointly to control only one of the interpolation FIR filters 12-14 per data channel, for example, to perform new sampling of a YUV image data stream.

Figure 2:
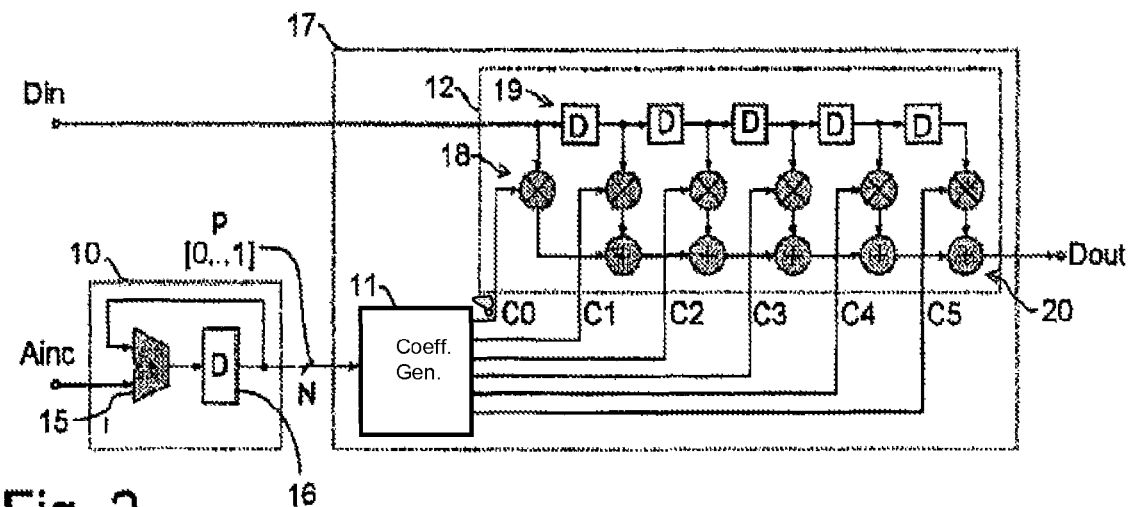

FIG. 2 shows an example of a circuit arrangement provided with a resampler architecture in a detailed representation of the phase accumulator 10 and of a single interpolation FIR filter 12. The interpolation FIR filter 12 and the coefficient generator 11 are accommodated only by way of an example in a common higher-order structural unit in which the actual resampler is formed as a variable delay element in the base stage for a single channel with input data Din.

The phase accumulator 10 is equipped with an adder and/or amplifier 15, whose output value is input to a delay element 16, D. One output of the delay element 16 is supplied back to a second input of the adder and/or amplifier 15 and processed together with the control signal Ainc, which is furnished to the first input. In addition, the output of the delay element 16 is connected to the input of the coefficient generator 11 as shown in FIG. 1. The phase accumulator outputs individual phase values p in a range [0 . . . 1] to a line arrangement having N individual lines.

In the interpolation FIR 12, provided by way of an example, is arranged a plurality of multipliers 18, of delay elements 19, D and of adders 20. The input data Din is in this case input to the delay elements 19 which are connected in series and delayed accordingly by each member of the delay elements 19. The input data Din is also input to the first multiplier of the multipliers 18 for multiplication with the first coefficient of the coefficients C0. Respective output values of the delay elements are input to the other multipliers 18, and coefficient values C1-C5 are further input to the multipliers 18. Accordingly, the multipliers 18 multiply each single coefficient C0-C5 by a data value of the input values Din or of the previous data values in a sequence of the input data Din. The last of the adders 20 outputs successively the output data Dout.

The basic construction thus consists of the phase accumulator 10, the coefficient generator 11 and one or more such interpolation filters, in particular interpolation FIR filters 12. The coefficient generator 11 and the interpolation filters 12-14 thus form a sub-sample interpolator. With a conversion in the sphere of communication connections, such a structure per se is referred to as a delay element. It is, however, possible to perform calculations not only with coefficients for a Lagrange polynomial interpolator, which is the case in the Farrow structure mentioned above. In contrast to the Farrow structure, the circuit arrangement architecture proposed in FIG. 1 and FIG. 2 offers a more limited complexity wherein a more generalized architecture is maintained so that it can be used for any desired interpolation functions and not only for a Lagrange polynomial interpolation. This makes it possible to generate any desired output phase in order to supply one or more desired phase values p by means of a relatively small number of stored coefficient formulations.

Another advantageous aspect of the preferred device and of the preferred method is the fact that coefficients are stored, preferably for a limited number of equidistant phase values p, wherein the power of 2 is preferred for this number.

Figure 3:
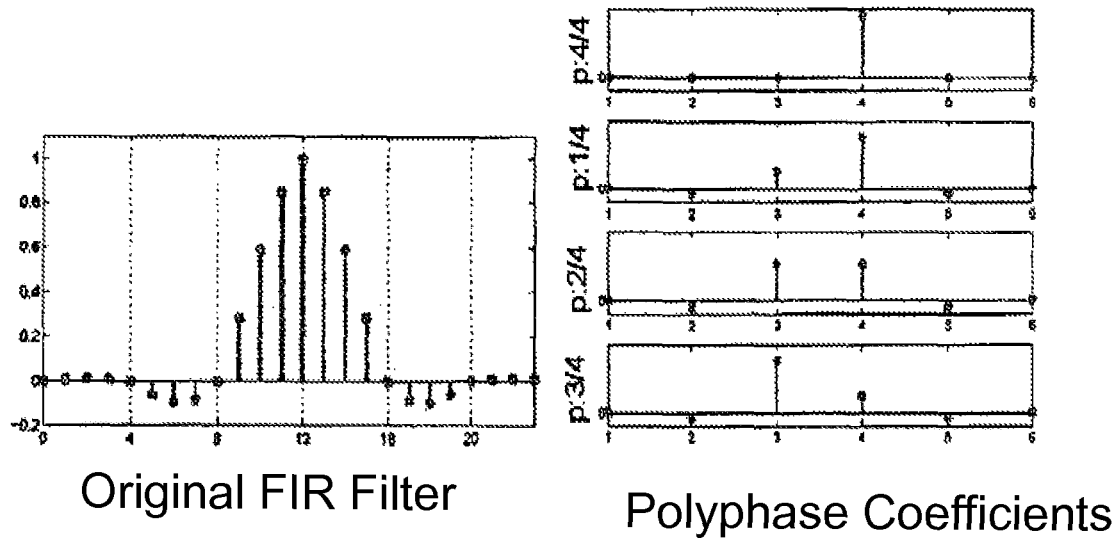

The actual filter coefficients C0-C5 are obtained for a given phase value p by a polyphasic decomposition of an original or initial interpolation function. This is described for example as shown in FIG. 3 for a six value interpolation filter with four phase values, or with an interpolation filter which has six taps. In this case, on the right side of the diagram is shown an illustration of the original FIR coefficient filter with 24 samples and a symmetrical construction at the median sample, which is normalized for the value 1.

Therefore, four examples of polyphase coefficients are illustrated in the diagram shown on the right side of FIG. 3 with only six respective coefficient values, which can correspond for example to the coefficients C0-C5 according to FIG. 1 and FIG. 2. The four illustrations on the right side of FIG. 3 here indicate corresponding polyphase coefficient formulations for phase values p=3/4, 2/4, 1/4, 0/4.

Figure 4:
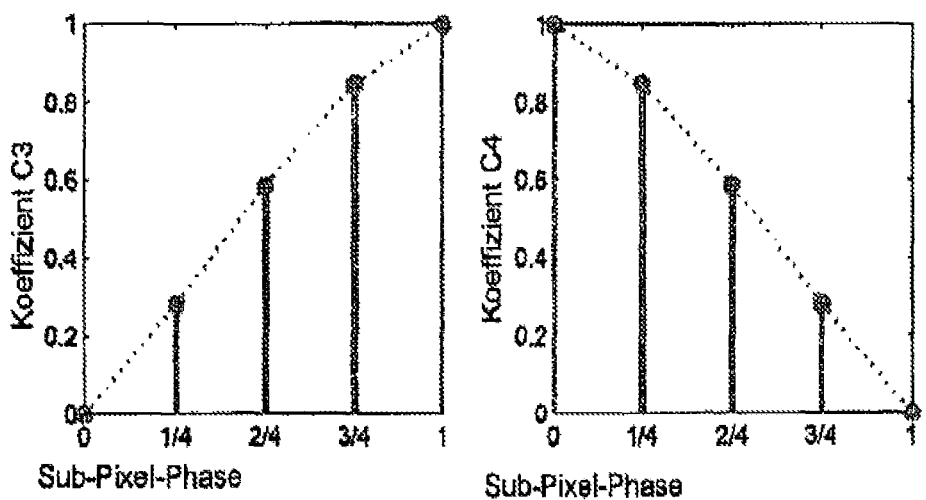

FIG. 4 illustrates the interpolation process for both central taps or sampling values of such a filter which is provided with six taps. The number of the coefficient formulation for P phase values p is in this case P+1 because the coefficients for a first phase 1 require a linear interpolation. These coefficients for the phase 1 are thus simply the coefficients for the phase 0 in reversed sequence. In the case of four polyphases, five coefficient formations are stored, one each time for the phase values p=0, 1/4, 2/4, 3/4, 1.

The sampling interval is thus divided into P segments with the same distances or widths. In order to carry out one linear interpolation, one segment number $K_S$ and one inter-segment phase $\phi$ are calculated according to $$K_s \lfloor P^*\phi_0 \rfloor, K_s \in \{0, 1, \ldots, P-1\} \text{ und} \qquad (2)$$

$$\phi_s = P \cdot \phi_0 - K_s, \phi_s \in [0 \ldots 1). \qquad (3)$$

The desired output phase in the range of $(0 \ldots 1)$ is in this case designated $\phi_0$. The internal output coefficient Cint is calculated with the linear interpolation from the selected adjacent coefficients CKS and CKS+1 according to $$C_{int} = C_{Ks} + \phi_s(C_{Ks+1} - C_{Ks}). \qquad (4)$$

Figure 5:
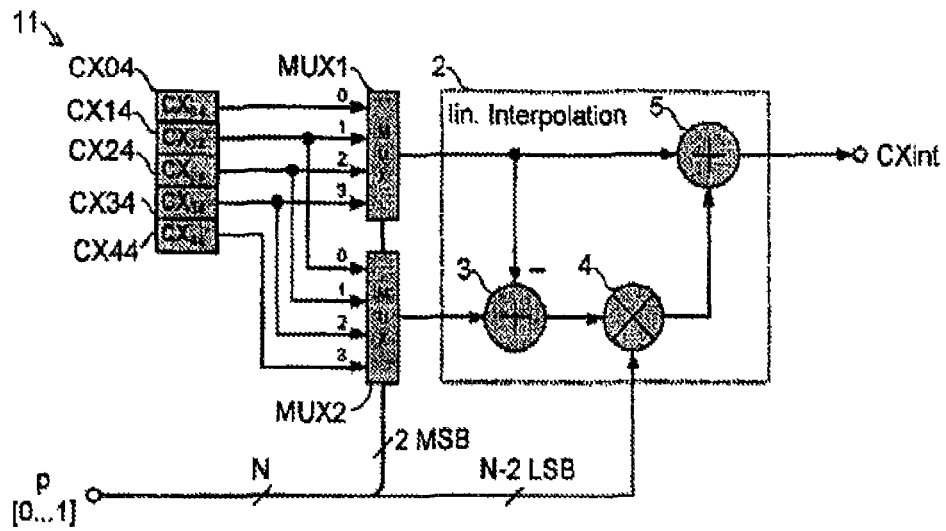

Converted to a hardware structure, the phase $\phi_0$ is coded by means of a fixed number of bits N. If the number of the coefficients is in the power of two, for example $2^Q$, the selection of both adjacent coefficients can be performed with two multiplexers MUX1, MUX2, which are formed by the first Q bit, that is to say the first Q MSB of the N bit phase word of the input phase value p. This is schematically illustrated in FIG. 5 for a coefficient generator 11. In this case, as shown in the illustration, constant coefficients CX04, CX14, CX24, CX34 and CX44 are input to the each of the four inputs 0-3 of both multiplexers MUX1, MUX2. The first four coefficients are input to the first of both multiplexers, namely MUX1, and the last four of these coefficients are input to the second of the multiplexers, namely MUX2. The output values of both multiplexers MUX1, MUX2 are input for example to an interpolation circuit 2 based on the construction corresponding to FIG. 9. Accordingly, a sequence of output data is output from this interpolation circuit in the form of an internal coefficient CXint.

The remaining N-Q bits of the phase value p represent the intra-segment phase $\phi_s$ and are used directly for the interpolation, i.e., they are input to the multiplier 4 of the interpolation circuit 2 for multiplication by the output value of the first adder 3 of the interpolation circuit 2. The result of the multiplication of the multiplier 4 is input to the second adder 5 of the interpolation circuit 2, to which the output data of the first multiplexer MUX1 is input, and which outputs the internal coefficient CXint. To the first adder 3 of the interpolation circuit 2 are input the output values of the second multiplexer MUX2 and for subtraction from these values are input the output values of the first multiplexer MUX1.

In most applications which are likely at present, the coefficients are normalized for each phase, that is to say their sum is 1. This ensures that an identical response will be obtained for all phases with alternating current. If this condition is not met, ripples can be encountered with slowly varied signals, which are displayed as undesirable high-frequency components in the spectrum of the interpolated signal.

When the coefficients exhibit a final precision, the linear interpolation process can influence the normalization of the coefficients. Simulations show that for discretization coefficients whose sum for each phase equals 256, the resulting sum can vary from the average value after the linear interpolation by a value of +/-2. According to a preferred embodiment of an advantageous circuit arrangement, the coefficients are normalized again to prevent or reduce such an influence after the linear interpolation. A similar normalization is performed by calculating the error of the sum of the coefficients and subtracting it from the value of the greatest of both central tap values or coefficient values. A model for a similar formulation is illustrated by way of an example in the interpolation filter which is provided with four taps as shown in FIG. 6.

Figure 6:
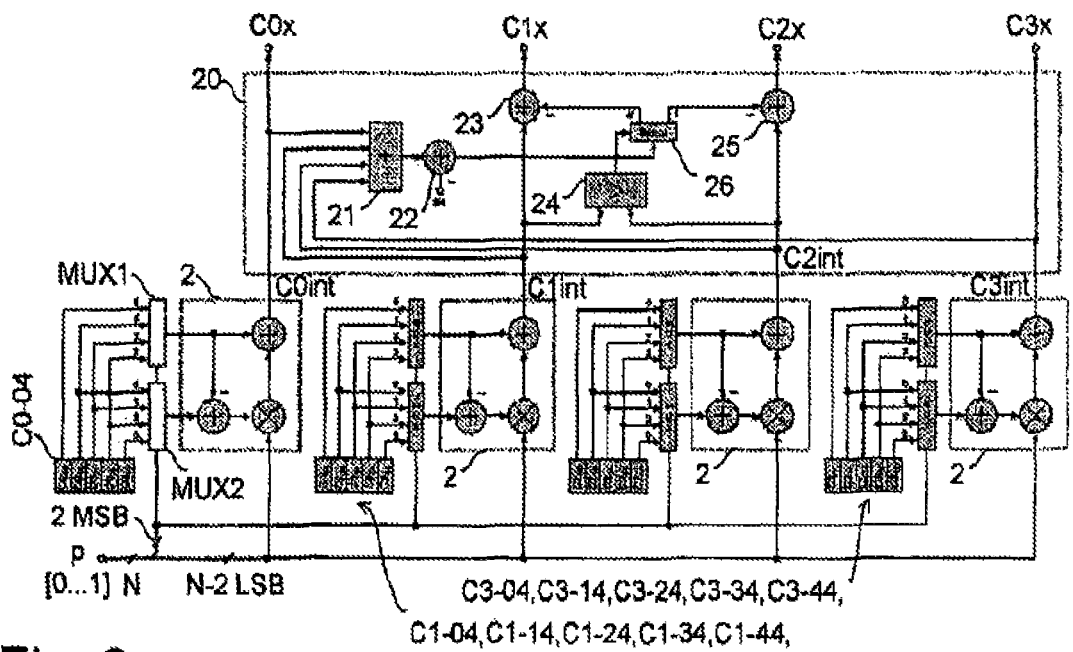

FIG. 6 shows an example of an arrangement in which the phase value p is input to a plurality of individual circuit arrangements according to FIG. 5. In each of the individual circuit arrangements, a formulation of constant coefficients is also input. For example, the coefficients of the second of these sub-arrangements are numbered by C1-04, C1-14, C1-34, C1-44, while the last of the four sub-groups of the circuit arrangement is displayed by way of an example with C3-04, C3-14, C3-24, C3-34, C3-44. Each of these circuit arrangements outputs a corresponding data output value as an internal coefficient C0int, C1int, C2int or C3int, which is input to a normalization circuit 20. The first and the last of these internal coefficients C0int and C3int will be output unchanged as the zero-order or third coefficient C0x, C3x by the normalization circuit 20. In the normalization circuit 20, all four internal coefficients C0int-C3int are furnished to an adder 21 of the normalization circuit 20 and added up therein. In a subsequent adder, a constant value, illustrated for example as the value 64, is subtracted from the result of the addition of this adder 21, which is a total of the values the constant coefficients C0-04, . . . , C3-44. The result of the output of this additional adder 22 is input to a demultiplexer 26 to which is also input an output signal of a greater/smaller comparison circuit 24. To this comparison circuit 24 are input the output values of both interpolation circuits 2 that are connected in series to both median coefficient determination stages. These internal coefficients C1int, C2int are also input to yet other adders 23, 25, in which the value 0 or 1 is input by the demultiplexer 26 for a corresponding subtraction depending on the result of the demultiplexing operation. Both of these additional adders 23, 25 then output the normalized median coefficients C1x, C2x which are used for the actual interpolation.

This type of a circuit arrangement can be advantageously used in particular for image scaling operations in video applications, for example for the scaling of a standard definition to so called high definition. Other spheres of application include for example conversion of audio sampling rates, the application of variable sub-sample delay elements in digital receivers, or the generation of so called Doppler fading taps in multi-purpose communication channels with temporal variation.

Figure 7:
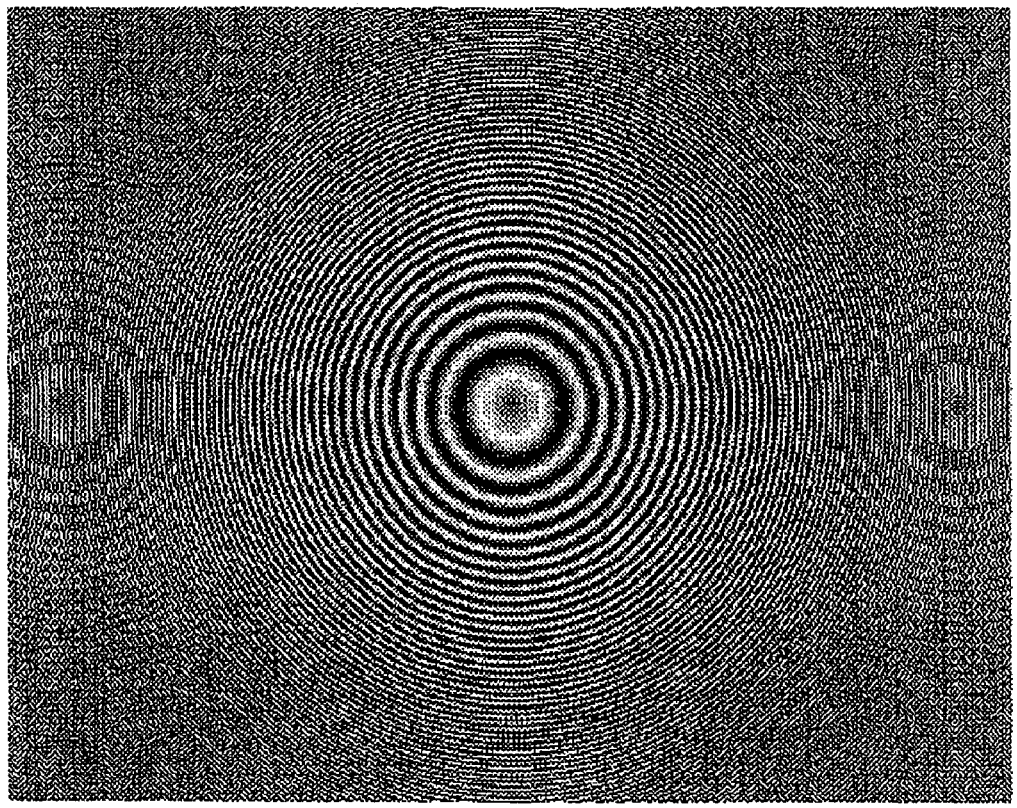
Figure 8:
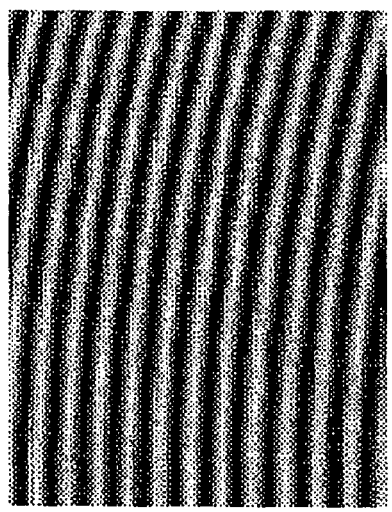

First simulations were performed for example for image scaling operations. In a typical test case, an image was scaled according to standard definition (720×576 picture elements) for a high definition display (1,920×1,080 picture elements). A standard definition zone plate test pattern for this purpose is shown in a simplified manner in FIG. 7. The section on the side of the edge on the left, representing the result of scaling based on high definition, is shown in FIG. 8 enlarged three times based on an image section with 90×120 picture elements. The 8-tap Lanczos interpolation was used for the scaling as a linear interpolation with eight coefficient formulations both in the horizontal and in the vertical direction.

The invention claimed is:
1. Device for polyphase resampling, provided with
a coefficient generator which provides a plurality of coefficients;
at least one interpolation circuit provided in the coefficient generator in order to generate coefficients from constant coefficients;
an interpolation arrangement for the realization of resampling by means of the coefficients based on input data to provide output data submitted for resampling wherein the coefficient generator is constructed and/or controlled in order to provide coefficients for the resampling as linearly interpolated coefficients;
  at least two multiplexers for multiplexing of a first coefficient sequence of coefficients at two inputs, respectively, of one of the interpolation circuits; and
  a phase accumulator to provide one phase value out of a plurality of bits;
  wherein the most significant bit in the plurality of the bits is input to the multiplexers in order to control these multiplexers, and the least significant bits in the plurality of the bits are input to the interpolation circuits.

2. The device according to claim 1, wherein a plurality of at least two data interpolation filters are provided for interpolation of a corresponding number of parallel input data, wherein the coefficients are output to each data interpolation filter.

3. The device according to claim 2, wherein the data interpolation filters are constructed as interpolation FIR filters.

4. The device according to claim 1, wherein the number of the most significant bits is input to the multiplexers according to the number of the multiplexers, and the remaining plurality in the plurality of bits are input, respectively, to all the interpolation circuits.

5. The device according to claim 1, provided with a plurality of at least two such interpolation circuits in the coefficient generator in order to generate coefficients from constant coefficients.

6. The device according to claim 1, provided with a storage section or a data input for the input of constant coefficients.

7. The device according to claim 1, provided with
  a plurality of at least two interpolation circuits in which a coefficient generator is deployed for generation of internal coefficients and
  a normalization circuit for the normalization of the internal coefficients.

8. A method for polyphase resampling comprising:
  providing a plurality of coefficients using a coefficient generator;
  generating the plurality of coefficients from a plurality of constant coefficients using at least one interpolation circuit;
  resampling an interpolation arrangement by means of the coefficients based on input data to provide output data submitted for resampling, wherein the coefficient generator is constructed and/or controlled in order to provide coefficients for the resampling as linearly interpolated coefficients;
  multiplexing a first coefficient sequence of coefficients at two inputs, respectively, of one of the interpolation circuits; and
  providing one phase value out of a plurality of bits from a phase accumulator;
  wherein the most significant bit in the plurality of the bits is input to the multiplexers in order to control these multiplexers, and the least significant bits in the plurality of the bits are input to the interpolation circuits.

9. The method of claim 8 wherein the number of the most significant bits is input to the multiplexers according to the number of the multiplexers and a remaining plurality in the plurality of bits are input, respectively, to all the interpolation circuits.

10. The method according to claim 8, wherein internal coefficients which are generated and provided for the resampling are normalized with the coefficients which are to be used.

11. The method according to claim 8, wherein the same coefficients are input to each data interpolation filter with a plurality of at least two data interpolation filters for the interpolation of a corresponding number of parallel input data.

12. The method according to claim 8, wherein in the coefficient generator will generate coefficients from constant coefficients.

* * * * *